US007452637B2

(12) United States Patent
Yan

(10) Patent No.: US 7,452,637 B2
(45) Date of Patent: Nov. 18, 2008

(54) METHOD AND APPARATUS FOR CLEAN PHOTOMASK HANDLING

(75) Inventor: Pei-yang Yan, Saratoga, CA (US)

(73) Assignee: Intel Corporation, Santa Clara, CA (US)

( * ) Notice: Subject to any disclaimer, the term of this patent is extended or adjusted under 35 U.S.C. 154(b) by 735 days.

(21) Appl. No.: 10/865,145

(22) Filed: Jun. 9, 2004

(65) Prior Publication Data

US 2005/0277031 A1    Dec. 15, 2005

(51) Int. Cl.
*G03F 1/00* (2006.01)
(52) U.S. Cl. ............................................. 430/5
(58) Field of Classification Search .................. 430/5; 428/14; 355/30, 75; 134/30
See application file for complete search history.

(56) References Cited

U.S. PATENT DOCUMENTS

| 6,153,044 | A | 11/2000 | Klebanoff et al. |
| 6,253,464 | B1 | 7/2001 | Klebanoff et al. |
| 6,492,067 | B1 * | 12/2002 | Klebanoff et al. .............. 430/5 |

OTHER PUBLICATIONS

Rader et al; "Verfication Studies of Thermophoretic Protection for EUV Masks", Emerging Lithographic Technologies VI, Proceedings of SPIE vol. 4688, 2002 SPIE, pp. 182-193.

* cited by examiner

*Primary Examiner*—Stephen Rosasco
(74) *Attorney, Agent, or Firm*—David L. Guglielmi

(57) ABSTRACT

Some embodiments of the present invention include protecting a photomask from particle defects by heating the photomask to initiate a thermophoretic force.

10 Claims, 4 Drawing Sheets

METHOD AND APPARATUS FOR CLEAN PHOTOMASK HANDLING

TECHNICAL FIELD

This invention relates to the field of lithography. In particular, the present invention relates to clean handling methods and apparatus for photomasks.

BACKGROUND

In semiconductor processing, patterns may be transferred from a photomask to the surface of a semiconductor wafer using lithography. Integrated circuits may then be formed on the semiconductor wafer. Typically, radiation may be projected through or reflected off a photomask and the radiation may be focused on a radiation sensitive layer to transfer the pattern of the photomask to the wafer surface. In addition to the desired pattern, any undesired defect on the photomask surface, such as a particle, may be transferred to the wafer surface causing failure of the integrated circuits.

BRIEF DESCRIPTION OF THE DRAWINGS

The invention is illustrated by way of example and not by way of limitation in the figures of the accompanying drawings, in which the like references indicate similar elements and in which.

DETAILED DESCRIPTION

In various embodiments, an apparatus and method relating to providing a particle free photomask are described. In the following description, various embodiments will be described. However, one skilled in the relevant art will recognize that the various embodiments may be practiced without one or more of the specific details, or with other methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Reference throughout this specification to "one embodiment" or "an embodiment" means that a particular feature, structure, material, or characteristic described in connection with the embodiment is included in at least one embodiment of the invention. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments.

Various operations will be described as multiple discrete operations in turn, in a manner that is most helpful in understanding the invention. However, the order of description should not be construed as to imply that these operations are necessarily order dependent. In particular, these operations need not be performed in the order of presentation.

Embodiments of the present invention include apparatus and methods that may reduce the number of particles that accumulate on the surface of a photomask. The invention may be used in any lithographic application where particle defects on a photomask surface may cause the formation of defective patterns. However, the invention may be particularly useful for extreme ultraviolet (EUV) lithography, where EUV radiation is absorbed by prior art pellicles. For clarity, lithographic applications will hereinafter be referenced as EUV lithography, although the invention may be applied to lithographic applications using other wavelengths of radiation.

Figure 1:
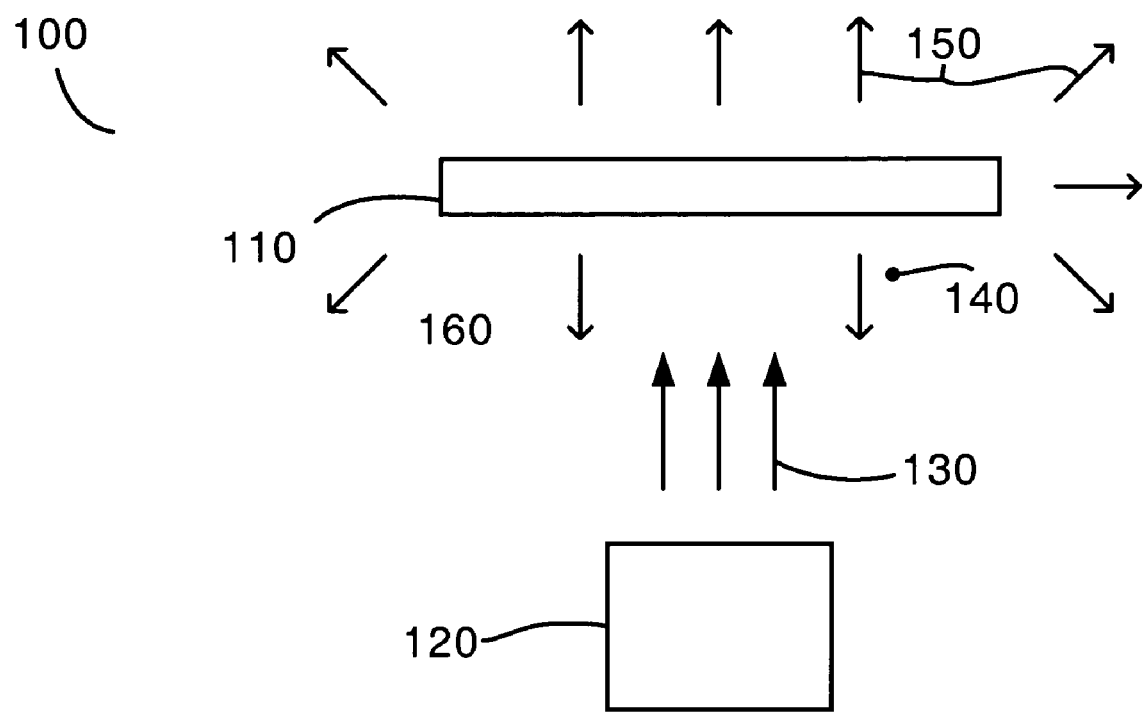
FIG. 1 illustrates a cross-sectional type view of an apparatus in accordance with one embodiment of the present invention.

FIG. 1 illustrates a cross-sectional view of an apparatus 100 in accordance with one embodiment of the present invention. The illustration includes a photomask 110, a radiation source 120, a radiation 130, at least one particle 140, a temperature gradient 150, and a surrounding gas 160. In general, the photomask may be disposed on a photomask holder (not shown), as further discussed below with reference to FIGS. 2 and 3, although a photomask holder may not be required. The photomask holder may be a carrier, platform, robot end-effector, stage, or any device to handle, use or store a photomask. Also, the radiation source 120 does not need to be attached to the photomask holder in the present invention.

Embodiments of the present invention may reduce the number of particles that accumulate on the photomask 110 by creating a thermophoretic force that repels the at least one particle 140. The radiation source 120 may emit a radiation 130 capable of heating the photomask 110. The heating of the photomask 110 may be due to absorption of the radiation 130 by the photomask 110. The photomask 110 may then be at a temperature higher than the temperature of the surrounding gas 160. The increased temperature of the photomask 110 may cause a temperature gradient 150 in the surrounding gas 160, where the gas temperature nearer the photomask 110 is greater than the gas temperature farther away from the photomask 110. Accordingly, the arrows illustrating the temperature gradient 150 are in the direction of decreasing temperature. The at least one particle 140 may then be repelled away from the photomask 110 in the direction of the temperature gradient 150 due to a thermophoretic force acting on the at least one particle 140 in direction of temperature gradient 150.

In general, a thermophoretic force may be exerted on a particle in a gas with a temperature gradient. The thermophoretic force may be due to the particle colliding with higher momentum gas molecules in higher temperature areas and lower momentum gas molecules in the lower temperature areas. The net effect of the collisions may cause a thermophoretic force on the particle in the direction of decreasing temperature. Accordingly, a thermophoretic force may act on the at least one particle 140 in the surrounding gas 160 in the direction of the temperature gradient 150 and away from the photomask 110.

Referring to FIG. 1, the photomask 110 may be an EUV photomask for use in EUV lithography. The photomask 110 may include Silicon, Molybdenum, Tantalum Nitride, Tantalum Germanium, or other suitable materials. In one embodiment, the EUV photomask may include a Molybdenum and Silicon multilayer that is about 280 to 350 nm thick and a metal absorber layer that is about a 70 nm thick. The radiation source 120 may be a pulsed or continuous laser selectively chosen from a wide variety of options to emit a radiation 130 that will be absorbed by and heat the photomask 110. In one embodiment, the radiation 130 may have a wavelength of about 150 to 1000 nm and a Molybdenum and Silicon multilayer and a metal absorber layer of the photomask 110 may absorb the radiation. Other wavelengths of the radiation 130, such as those larger than 1000 nm, may also heat the photomask 110.

For simplicity of illustration in FIG. 1, the radiation 130 is shown perpendicular to a portion of a surface of the photomask 110. However, the radiation 130 may be applied to the photomask 130 in a variety of methods to heat the photomask 110. In one embodiment, the radiation 130 may be applied to an entire surface of the photomask 110. In such an embodiment, the radiation may be spread out from a radiation source 120 using optics (not shown) to expand the radiation across an entire surface of the photomask 110. In another embodiment, the radiation 130 may be incident to a portion of a surface of the photomask 110 and may be applied to the entire surface by scanning the radiation 130 or moving the photomask 110. Further, the radiation 130 may be applied at a non-perpendicular angle to any surface of the photomask 110. Other methods, including using multiple radiation sources, may be used.

The effect of the thermophoretic force associated with the temperature gradient 150 may depend on several variables, including the pressure of the surrounding gas, the magnitude of the temperature gradient, and others. In general, a larger temperature gradient 150 and a higher gas pressure will each cause a larger thermophoretic force on the at least one particle 140. A larger temperature increase in the temperature of the photomask 110 may cause a larger associated temperature gradient 150. To compensate for low pressure in the surrounding gas 160, a larger temperature gradient 150 may be caused by increasing the temperature of the photomask 110. For example, increasing the intensity of the radiation 130 may increase the temperature of the photomask 110. In one embodiment, the pressure may be 1 atmosphere and the photomask 110 may be heated about 1 to 5 degrees Celsius above the surrounding environment to achieve the desired thermophoretic force. In another embodiment, the pressure of the surrounding gas 160 may be 10 to 15 millitorrs and the photomask 110 may be heated about 10 to 15 degrees Celsius above the surrounding environment. Many other combinations of temperature and pressure may be available.

Figure 2:
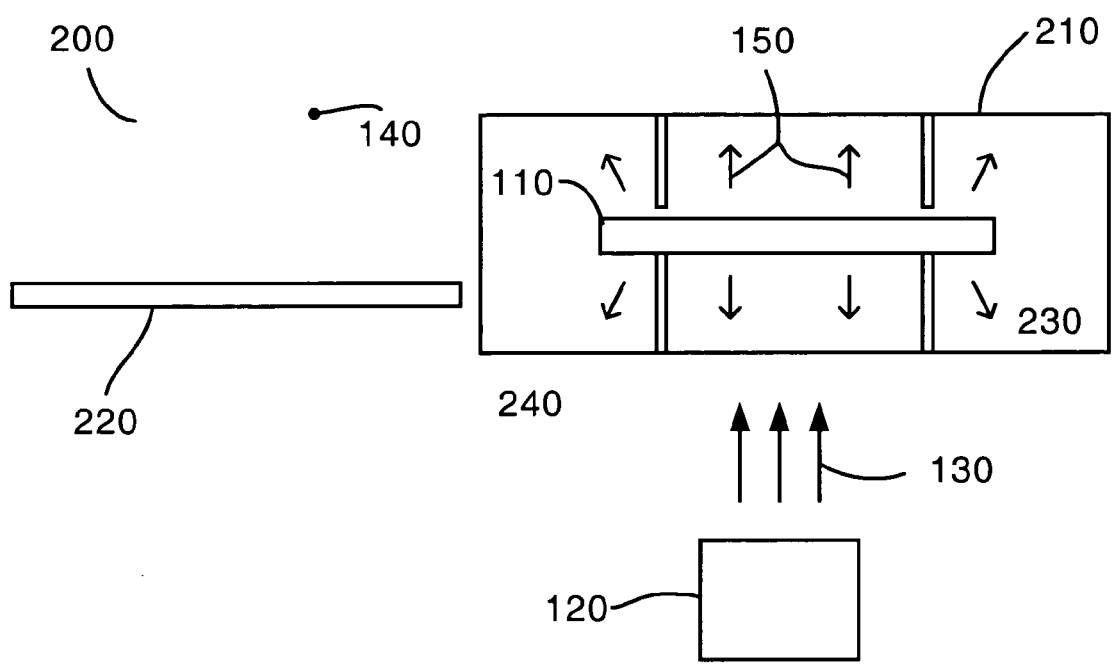
FIG. 2 illustrates a cross-sectional type view of an apparatus in accordance with one embodiment of the present invention.

FIG. 2 illustrates an apparatus 200 in accordance with one embodiment of the present invention. In FIG. 2, the photomask 110 may be inside a carrier 210. The illustration includes an end-effector 220, a gas inside the carrier 230, and a gas outside the carrier 240. The end-effector 220 may be the "hand" of a robotic arm or any device used to handle the photomask 110. The at least one particle 140 may be outside the carrier 210, as illustrated, or inside the carrier 210.

In FIG. 2, the entire carrier 210 may be substantially transparent to the radiation 130 produced by the radiation source 120 or the carrier may include a window (not shown) that may be substantially transparent to the radiation 130. The carrier 210 or a window of the carrier 210 may comprise quartz, glass, plastic, calcium fluoride or any other suitable material. The radiation 130 may pass through the carrier 210, without substantially heating the carrier 210, and contact the photomask 110. The radiation 130 may be absorbed by the photomask 110. In one embodiment, a radiation 130 with a wavelength of about 150 to 1000 nm may be substantially absorbed by a Molybdenum and Silicon layer and metal absorber layer of the photomask 110, but may not be substantially absorbed by the carrier 210. Other wavelengths of the radiation 130, such as those larger than 1000 nm, may also be substantially absorbed by the photomask 110, but not be substantially absorbed by the carrier 210.

The photomask 110 may then be heated to a temperature greater than the carrier 210, the gas inside the carrier 230, and the gas outside the carrier 240. The heated photomask 110 may create a temperature gradient 150 in the surrounding environment analogous to the temperature gradient 150 illustrated in FIG. 1. The temperature gradient and associated thermophoretic force may repel the at least one particle 140 away from the photomask 110. The photomask 110 may be protected from the at least one particle as the carrier 210 is opened and the photomask 110 may be handled with the end-effector 220 and removed from the carrier 210. The photomask 110 may remain at a higher temperature after the radiation 130 no longer contacts the photomask 110. The increase in temperature and associated thermophoretic force may protect the photomask 110 during subsequent handling. In one embodiment of the present invention, the gas inside the carrier 230 may be assumed to be particle free, the photomask 110 may be heated, and the photomask 110 may be protected from the at least one particle 140 while handled with the end-effector 220.

As discussed with respect to FIG. 1, the radiation 130 may be applied to photomask 110 in a number of ways. In one embodiment, the radiation 130 may be applied to an entire surface of the photomask 110 by spreading the radiation using optics (not shown). In another embodiment, the radiation 130 may be applied to a portion of the surface of the photomask 110 and the radiation 130 may be scanned or the photomask 110 and carrier 210 may be moved to apply the radiation to the entire photomask 110. In yet another embodiment, the carrier 210 may comprise a window (not shown) that may be substantially transparent to the radiation 130 and the radiation 130 may be applied to the photomask 110 through the substantially transparent window. Although the radiation 130 is shown perpendicular to a surface of the photomask 110, the radiation may be applied in a variety of ways, including application at a non-perpendicular angle to any surface of the photomask 110.

Figure 3:
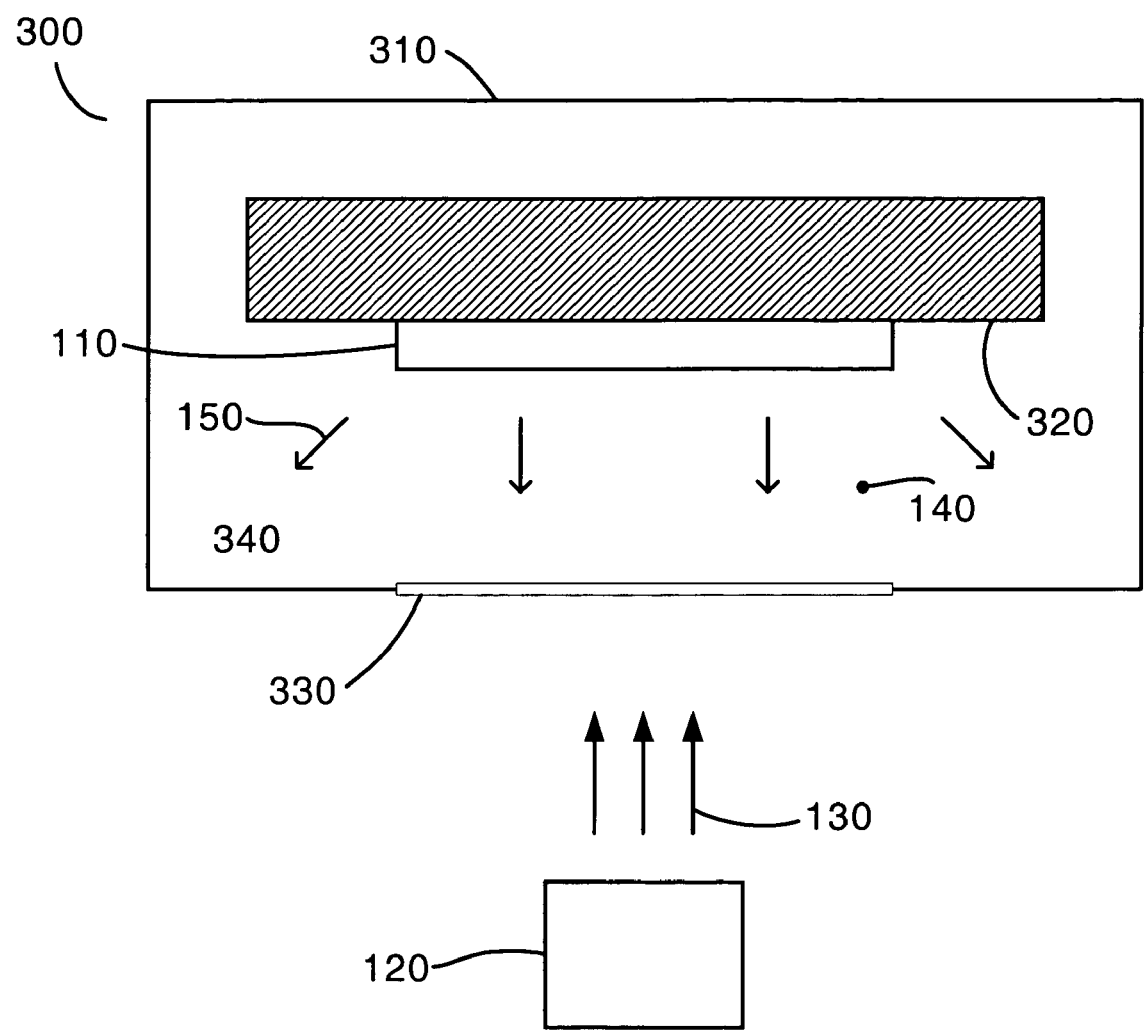
FIG. 3 illustrates a cross-sectional type view of an apparatus in accordance with one embodiment of the present invention.

FIG. 3 illustrates a cross-sectional view of an apparatus 300 in accordance with one embodiment of the present invention. In FIG. 3, the photomask 110 may be disposed on a stage 320 inside a chamber 310 that may include a window 330. The radiation source 120 may be outside the chamber 310 or inside the chamber 310 (not shown), where the window 330 may not be required. The chamber 310 may be an EUV lithography tool chamber, vacuum load lock, or the like. The window 330 may be of a material that is significantly transparent to the radiation 130, such as quartz, glass, plastic, calcium fluoride or any other suitable material. The radiation 130 may pass though the window 330, without substantially heating the window 330, and contact the photomask 110, which may be heated to a temperature above the temperature of the gas inside the chamber 340. In one embodiment, the radiation 130 may have a wavelength of about 150 to 1000 nm and may be absorbed by a Molybdenum and Silicon multilayer and metal absorber layer of the photomask 110. Other wavelengths of the radiation 130, such as those larger than 1000 nm, may also heat the photomask 110. The heated photomask 110 may then create a temperature gradient 150 in the gas inside the chamber 340 that may protect the photomask 110 from the at least one particle 140 by a thermophoretic force. Further, the present invention may provide a clean method for handling the photomask 110 during transfer into, out of, or within the chamber 310. Although the photomask 110 is shown on the bottom surface of a stage 320 and the radiation source 120 below the photomask 110, a wide range of orientations of the illustrated elements may be used in the present invention.

In one embodiment, the chamber 310 may be a vacuum load lock or a pump down chamber. A low-pressure pump down environment may be necessary for EUV lithography processing, which may occur at low pressure. The pump down process may be particularly susceptible to particle generation and the present invention may provide protection during pump down and subsequent photomask handling. The pressure in the pump down chamber may be reduced to approximately 10-50 millitorr and the photomask 110 may be heated to a temperature approximately 10-15 degrees Celsius above the temperature of the gas inside the chamber 340 to achieve a desired temperature gradient 150 and thermophoretic force. Other combinations of pressure and temperature may be available to create a temperature gradient 150 and associated thermophoretic force to protect the photomask 110 from the at least one particle 140.

In another embodiment of the present invention, the chamber 310 may be the chamber of an EUV lithography tool. The chamber of an EUV lithography tool may be the portion of the tool where an EUV radiation reflects off the photomask 110 and is focused onto a semiconductor wafer (not shown). The photomask 110 may be disposed on a stage 320 and scanned for exposure of a semiconductor wafer (not shown) while the radiation 130 heats the photomask 110 to provide protection against the at least one particle 140. The present invention may protect the photomask 110 during handling into, out of, or within the EUV lithography tool.

In additional embodiments of the present invention, the illustrated embodiments may be employed together to provide protection for a photomask. For example, the photomask may be received in a clean carrier from a vendor or internal supplier. The present invention may protect the photomask while handling it from the clean carrier to a pump down chamber or EUV lithography tool. Alternatively, the present invention may protect the photomask during use in an EUV lithography tool and subsequent handling into a clean carrier.

Figure 4:
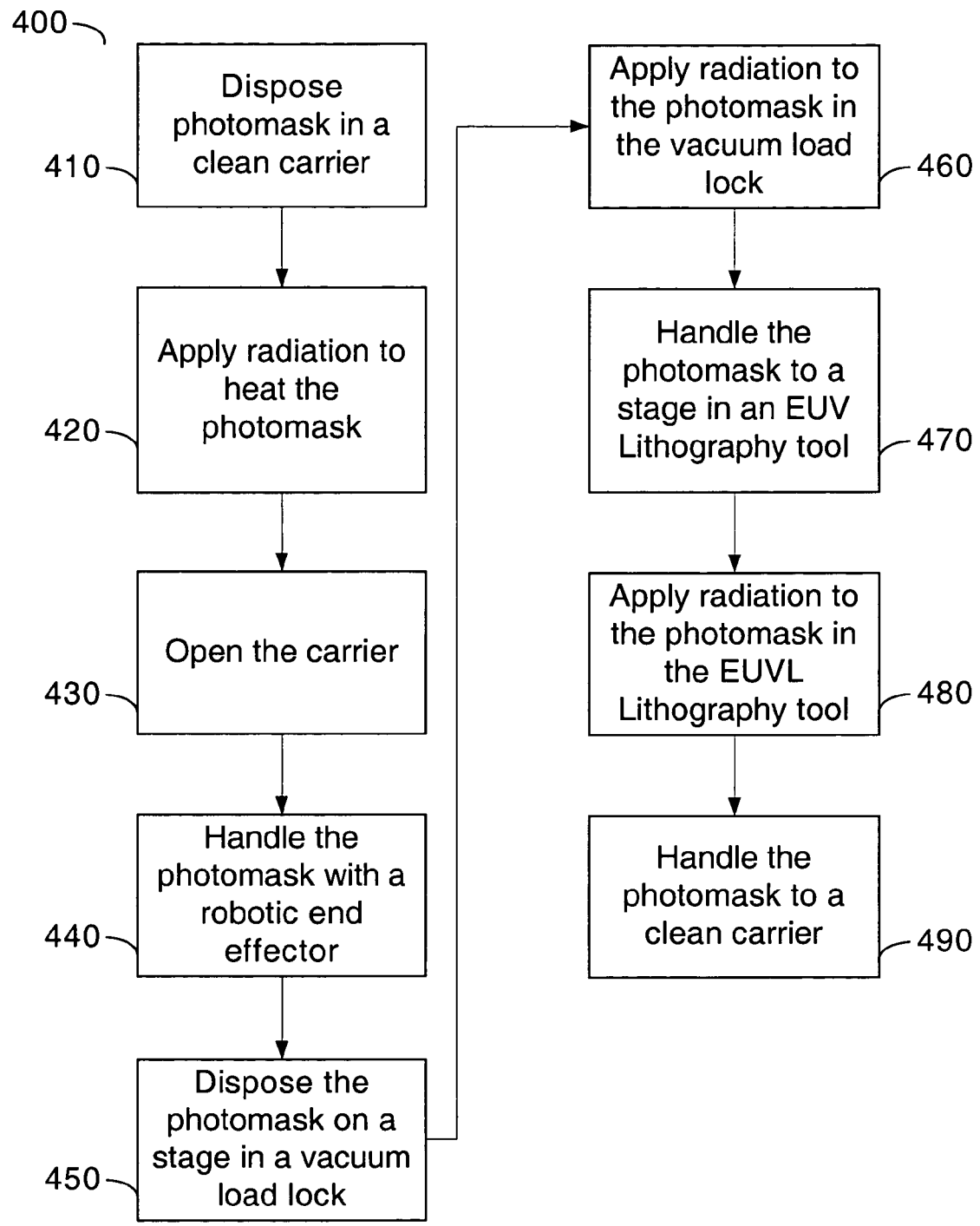
FIG. 4 illustrates an operational flow of a method in accordance with one embodiment of the present invention.

FIG. 4 illustrates one embodiment of the present invention in a method 400. In box 410, the photomask is disposed in a clean carrier. In one embodiment, the clean carrier may be assumed to be particle free. A radiation may be applied to heat the photomask, as shown in box 420. As discussed above, particles may be repelled from the heated photomask due to a thermophoretic force. The carrier may be opened and the photomask may be handled with a robotic end effector, as illustrated in boxes 430, 440. In one embodiment, the photomask will remain at a temperature sufficient to create a repellant thermophoretic force in the adjacent environment as it is handled. In another embodiment, the photomask may be continuously radiated during carrier opening and handling. In box 450, the photomask is disposed on a stage in a vacuum load lock. A radiation may be applied to the photomask as illustrated in 460 to repel particles before, during, and after pump down of the vacuum load lock. Due to lower environmental pressures achieved in the vacuum load lock, the temperature increase in the photomask may have to be substantial to achieve the desired thermophoretic force, as discussed above. As shown in box 470, the photomask may be handled to the stage of an EUV lithography tool. Again, the photomask may remain at a temperature sufficient to achieve a thermophoretic force during the handling illustrated in box 470 or the photomask may be radiated during the photomask handling. During, before, and after operation of the EUV lithography tool, radiation may be applied to heat the photomask, as illustrated in box 480. The photomask may be handled to a clean carrier as illustrated in box 490. As will be appreciated, there may be many combinations available for use of the present invention and FIG. 4 is not meant to be limiting. In embodiments of the present invention, the radiation may be applied in all the boxes indicated in method 400 or only in certain boxes as needed.

It is to be understood that the above description is intended to be illustrative, and not restrictive. Many other embodiments will be apparent to those of ordinary skill in the art upon reviewing the above description. The scope of the invention should, therefore, be determined with reference to the appended claims, along with the full scope of equivalents to which such claims are entitled.

What is claimed is:

1. A method comprising;
   disposing a photomask on a photomask holder; and
   applying a radiation to the photomask, wherein the radiation heats the photomask to a temperature greater than a temperature of a surrounding gas to create a thermophoretic force to repel particles, wherein the photomask holder comprises a carrier, at least a portion of the carrier is substantially transparent to the radiation, and the radiation is applied through the portion of the carrier that is substantially transparent to the radiation.

2. The method of claim 1, further comprising:
   removing the photomask from the carrier, wherein the photomask remains at a temperature greater than a temperature of a surrounding gas.

3. The method of claim 1, wherein the carrier comprises at least one of quartz, glass, plastic, or calcium fluoride.

4. The method of claim 1, wherein the photomask comprises an EUV photomask.

5. The method of claim 4, wherein the EUV photomask comprises a Molybdenum and Silicon multilayer and a metal absorber layer.

6. The method of claim 1, wherein the photomask comprises at least one of Silicon, Molybdenum, Tantalum Nitride, or Tantalum Germanium.

7. The method of claim 1, wherein the radiation comprises at least one of pulsed laser light or continuous wave laser light.

8. The method of claim 1, wherein the temperature greater than the temperature of the surrounding gas is about 1 to 5 degrees Celsius greater than the temperature of the surrounding gas, and the surrounding gas has a pressure of about 1 atmosphere.

9. The method of claim 1, wherein the temperature greater than the temperature of the surrounding gas is about 10 to 15 degrees Celsius greater than the temperature of the surrounding gas, and the surrounding gas has a pressure of about 10 to 15 millitorrs.

10. The method of claim 1, wherein the radiation has a wavelength of about 150 to 1000 nm.

\* \* \* \* \*